United States Patent [19]

Bouilloux et al.

[11] Patent Number: 5,959,042
[45] Date of Patent: Sep. 28, 1999

[54] MATERIAL COMPRISING A POLYAMIDE, A POLYMER HAVING POLYAMIDE AND POLYETHER BLOCKS AND A FUNCTIONALIZED POLYOLEFIN, AND FILM AND OBJECT OBTAINED THEREFROM

[75] Inventors: Alain Bouilloux, Bernay; Patrick Alex, Limours Pecqueuse, both of France

[73] Assignee: Elf Atochem S.A., Puteaux, France

[21] Appl. No.: 08/971,031

[22] Filed: Nov. 14, 1997

[30] Foreign Application Priority Data

Nov. 19, 1996 [FR] France .................................. 96 14150

[51] Int. Cl.⁶ ..................................................... C08L 77/00
[52] U.S. Cl. ............................ 525/420; 525/66; 525/179; 525/183; 525/408; 525/430; 525/432; 528/170; 528/310; 528/322; 528/332; 428/474.4
[58] Field of Search ................................ 525/66, 179, 183, 525/432, 408, 430, 420; 528/170, 310, 332, 322; 428/474.4

[56] References Cited

U.S. PATENT DOCUMENTS

| | | |
|---|---|---|
| 4,230,838 | 10/1980 | Foy et al. .................................. 525/408 |
| 4,252,920 | 2/1981 | Deleens et al. ........................... 525/430 |
| 4,331,786 | 5/1982 | Foy et al. .................................. 525/408 |
| 4,970,274 | 11/1990 | Chacko et al. ........................... 525/432 |
| 5,506,024 | 4/1996 | Flesher .................................. 428/474.4 |
| 5,571,096 | 11/1996 | Dobrin et al. ........................... 604/383 |
| 5,663,229 | 9/1997 | Presenz et al. .......................... 524/504 |
| 5,674,579 | 10/1997 | Ladouce et al. ........................ 525/179 |
| 5,800,928 | 9/1998 | Fischer et al. ........................... 428/500 |
| 5,869,414 | 2/1999 | Fischer et al. ........................... 442/398 |

FOREIGN PATENT DOCUMENTS

| | | |
|---|---|---|
| 0 342 066 | 11/1989 | European Pat. Off. . |
| 0 476 963 | 3/1992 | European Pat. Off. . |
| 0 560 630 | 9/1993 | European Pat. Off. . |
| 1-090 236 | 4/1989 | Japan . |

*Primary Examiner*—P. Hampton-Hightower

[57] ABSTRACT

A material is provided comprising: (a) a polyamide; (b) a polymer having PA blocks and polyether PEG blocks; (c) optionally a polyolefin; (d) a functionalized polyolefin; the various constituents being present in amounts by weight, a, b, c and d such that: $a>0$; $b>0$; $c+d>0$; $a+b+c+d=100$; with $a/b>0.2$; $(a+b)/(c+d)>1$; and $b/(a+b+c+d)<0.5$. A film which is non-porous but breathable, i.e. porous to water vapor but not to water, and an antistatic object obtained from this material are also provided.

38 Claims, No Drawings

MATERIAL COMPRISING A POLYAMIDE, A POLYMER HAVING POLYAMIDE AND POLYETHER BLOCKS AND A FUNCTIONALIZED POLYOLEFIN, AND FILM AND OBJECT OBTAINED THEREFROM

BACKGROUND OF THE INVENTION

The present invention relates to a material comprising a polyamide, a polymer having polyamide and polyether block and a functionalized polyolefin, optionally with a polyolefin. The invention also relates to an impermeable yet breathable or nonporous breathable film and an antistatic object obtained from this material.

European patent application 0,378,015, for example, discloses non porous breathable films, in other words films that are permeable to water vapor but which are impermeable to water, based on a polymer having polyamide and polyether blocks.

U.S. Pat. No. 4,970,274 discloses a polyamide and polyamide and polyether polymers, for applications such as films. The proportion of block polyamide and polyether polymer in the mixture is specified as being comprised between 5 and 20% by weight, and the advantage provided by the mixture is that of providing films intended, for example for vacuum packaging.

European Patent Application 0,476,963 discloses water vapor permeable films based on polyamide block and polyethylene glycol block polymer, mixed with (a) a block polymer not having polyethylene glycol blocks, (b) a polyamide, (c) a polyester or (d) a polyurethane. In all the examples, firstly, only a combination with simply a polyamide is given as an example and, secondly, the amount of polyamide block and polyethylene glycol block polymer is significant, being 75 or 50% by weight. This patent application still teaches that the nonporous breathable properties are provided by the majority phase.

None of these documents teaches, nor suggest, the present invention.

SUMMARY OF THE INVENTION

Thus, the invention provides a material comprising:

(a) a polyamide;

(b) a polymer having PA blocks and polyether PEG blocks;

(c) optionally a polyolefin;

(d) a functionalized polyolefin; the various constituents being present in amounts by weight, a, b, c and d such that:

$a>0; b>0; c+d>0; a+b+c+d=100;$ with $a/b>0.2; (a+b)/(c+d)>1;$ and $b/(a+b+c+d)<0.5.$ According to one embodiment the various constituents of the material are present in amounts by weight a, b, c and d such that:

$2>a/b>0.5.$

According to one embodiment, the various constituents of the material are present in amounts by weight a, b, c and 2 such that:

$0.3<b/(a+b+c+d)<0.5$

According to a further embodiment, in the material, the PA blocks of polymer (b) are PA6 blocks.

In the material, the polyamide can be PA6, PA6,6 or PA12; in one embodiment, the polyamide is PA6.

In a preferred material, the polyamide is PA6 and the polymer having PA blocks and polyether PEG blocks is a PA6/PEG block polymer.

In a further preferred material, the polyamide is PA6,6 and the polymer having PA blocks and polyether PEG blocks is a PA6/PEG block polymer.

In another preferred material, the polyamide is PA12 and the polymer having PA blocks and polyether PEG blocks is a PA12/PEG block polymer.

In another preferred material, the polyamide is PA6 and the polymer having PA blocks and polyether PEG blocks is a PA12/PEG block polymer.

According to one embodiment, the functionalized polyolefin (d) is selected from (d1) ethylene and alpha-olefin homo- or copolymers with a monomer being carboxylic acid, an anhydride of said acid, a salt of said acid, an unsaturated epoxide, said monomer being grafted or terpolymerized;

(d2) copolymers of ethylene/alkyl (meth)acrylate/ unsaturated monomer having a carboxylic acid functionality or carboxylic acid anhydride functionality, said monomer being grafted or terpolymerized;

(d3) copolymers of ethylene/alkyl (meth)acrylate/ unsaturated monomer having an epoxy functionality, said monomer being grafted or terpolymerized;

(d4) copolymers of ethylene/carboxylic acid vinyl esters/ unsaturated monomer having carboxylic acid functionality or carboxylic acid anhydride functionality, said monomer being grafted or terpolymerized; said functionalized polyolefins being optionally mixed with a di-functional reactive unit.

In another embodiment, the polyolefin (c) is polyethylene.

The invention also relates to a non porous breathable film and an antistatic object obtained from the material according to the invention.

DETAILED DESCRIPTION OF PREFERRED EMBODIMENTS

The invention will now be described in detail.

In this present application, the term "polyamide (a) stands for the condensation products:

of one or several amino-acids such as aminocaproic, amino-7-heptanoic, amino-11-undecenoic and amino-12-dodecanoic acid; or one or several corresponding lactames such as caprolactame, oenanlactame and lauryllactame; or of one or several substantially stoechiometric combinations of one or several aliphatic and/or cycloaliphatic and/or aromatic-aliphatic diamines, or salts thereof, with one or several aliphatic or aromatic carboxylic diacids or salts thereof; examples of such diamines are hexamethylenediamine, dodecamethylenediamine, metaxylylenediamine, bis(4-aminocyclohexyl)-methane (BACM), bis (3-methyl-4-amino-cyclohexyl)-methane (BMACM) and trimethylhexamethylenediamine, examples of diacids being terephthalic, isophthalic, adipic, azelaic, sebacic, suberic and docedanedicarboxylic acid; or any mixture of the above monomers; and any mixture of the resulting condensation products, optionally with other polymers compatible with the polyamides.

By way of example, the polyamide is PA6, PA6,6, PA6, 10, PA11, PA12, PA6,12 and PA12,12. The molecular weight of the polyamides can vary greatly, as those skilled in the art will understand.

Mixtures of polyamide are also possible.

Polyolefin (c) is a homopolymer or copolymer of alpha-olefins and or diolefins, such as for example ethylene, propylene, butene-1, octene-1, butadiene.

Examples are homopolymers such as polyethylene, in particular LDPE, HDPE, LLDPE, or VLDPE, polyethylene metallocene or polypropylene;

ethylene/alpha-olefin copolymers such as ethylene/propylene, the EPRs;

styrene/ethylene-butene/butadiene (SEBS), styrene/butadiene/styrene (SBS), styrene/isoprene/styrene (SIS), styrene/ethylene-propylene/styrene (SEPS) and ethylene/propylene/diene (EPDM) block copolymers;

copolymers of ethylene with at least one product selected from unsaturated carboxylic acids salts or esters such as alkyl (meth)acrylate, typically methyl acrylate, or vinyl esters of saturated carboxylic acids such a vinyl acetate, in which the proportion of comonomer can be up to 40% by weight.

The copolymers mentioned above can be copolymerized in a random or sequenced manner and have a linear or branched structure.

The polyolefins have, for example, a density comprised between 0.86 and 0.965 and a melt flow index MFI comprised, for example, between 0.3 and 40. The polyolefins can also be cross-linked, using any suitable agent (epoxy, etc.).

Polyolefin mixtures are also possible.

The term "functionalized polyolefin" represents polymers of alpha-olefins and reactive units (functionalities); such reactive units are acid, anhydride or epoxy functionalities.

As examples, we can cite the polyolefins (c) previously grafted or co- or ter-polymerized by unsaturated epoxides such as glycidyl (meth)acrylate, or by carboxylic acids or the corresponding salts or esters such as (meth)acrylic acid (the latter being able to be partially or completely neutralized by metals such as Zn, etc.) or, further, by carboxylic acid anhydrides such as maleic anhydride.

The functionalized polyolefin (d) can be the following (co)polymers, grafted with maleic anhydride or glycidyl methacrylate, in which the grafting rate is for example from 0.01 to 5% by weight:

PE, PP, copolymers of ethylene with propylene, butene, hexene or octene containing, for example, 35 to 80% by weight ethylene;

ethylene and vinyl acetate (EVA) copolymers containing up to 40% by weight vinyl acetate;

ethylene and alkyl (meth)acrylate copolymers containing up to 40% by weight alkyl(meth)acrylate;

ethylene and vinyl acetate (EVA) and alkyl (meth)acrylate copolymers, containing up to 40% by weight comonomers.

ethylene/propylene copolymers having a majority of propylene grafted with maleic anhydride and then condensed with mono-aminated polyamide (or a polyamide oligomer). These products are described in European patent application 0,342,066.

The functionalized polyolefin (d) can also be a co- or ter-polymer of at least one of the following units: (1) ethylene, (2) alkyl (meth)acrylate or (meth) acrylic acid or saturated carboxylic acid vinyl ester and (3) maleic anhydride or glycidyl (meth)acrylate.

As an example of functionalized polyolefins of the latter type, the following copolymers can be mentioned in which ethylene represents preferably at least 60% by weight and where the termonomer represents, for example, 0.1 to 10% by weight of the copolymer:

ethylene/alkyl (meth)acrylate or (meth)acrylic acid/maleic anhydride or glycidyl methacrylate copolymers;

ethylene/vinyl acetate/maleic anhydride or glycidyl methacrylate copolymers;

ethylene/vinyl acetate/alkyl (meth)acrylate or (meth)acrylic acid/maleic anhydride or glycidyl methacrylate copolymers.

In the above copolymers, the (meth)acrylic acid can be put in the form of a Zn or Li salt.

The term "alkyl (meth)acrylate" stands for C1 to C6 alkyl methacrylates and acrylates and can be chosen from, methyl, ethyl, n-butyl, iso-butyl and 2-ethylhexyl acrylate, and methyl and ethyl methacrylate.

Advantageously, the functionalized polyolefin (d) is an ethylene/butyl acrylate/maleic anhydride copolymer or an ethylene/ethyl acrylate/glydidyl methacrylate copolymer.

Moreover, these polyolefins can also be cross-linked using any suitable process or agent (di-epoxy, diacid, peroxy, etc.); the expression functionalized polyolefin also covers the above polyolefins with a bi-functional reagent such as di-acid, di-anhydride, di-epoxy, etc. able to react with the former.

The molecular weight, MFI index and density of these functionalized polyolefins can also vary greatly, as those skilled in the art will understand.

Mixtures of functionalized polyolefins are also possible.

The polymer (b) having polyamide (PA) blocks and polyether polyethylene glycol (PEG) blocks is the constituent that provides the material of the invention with its valuable properties.

Such polymers having polyamide blocks and polyether PEG blocks result from co-polycondensation of polyamide sequences having reactive terminations and polyether sequences having reactive terminations, such as, among others:

polyamide sequences having diamine terminations with polyoxyalkylene sequences having dicarboxylic terminations;

polyamide sequences having dicarboxylic terminations with polyoxyalkylene sequences having diamine terminations obtained by cyanoethylation and hydrogenation of aliphatic dihydroxy alpha-omega polyoxy alkylene sequences, known as polyetherdiols;

polyamide sequences having diamine terminations with polyetherdiol sequences, the products obtained being, in this particular case, polyetheresteramides (abbreviated to PEEA below).

Such polymers are for example described in French patents Ser. Nos. 74 18913 and 77 26678 as well as in the following U.S. Pat. Nos.: 4,331,786, 4,115,475, 4,195,015, 4,839,441, 4,864,014, 4,230,838 and 4,332,920 the content of which is incorporated herein by reference.

The polyamide sequences having dicarboxylic terminations are for example obtained from condensation of aminocarboxylic alpha-omega acids, from lactames or substantially stoechiometric combinations of carboxylic diacids and diamines, in the presence of a chain limiting carboxylic diacid. The polyamide blocks are PA11, PA12, or PA11,12. Advantageously, the polyamide blocks are PA12. The mean molecular weight Mn of the polyamide sequences PA varies between 300 and 15,000 and, preferably, from 600 to 5,000.

The polyether is polyethylene glycol (PEG).

Regardless of whether the polyether blocks are included in the polymer chain having polyamide blocks and polyether blocks in the form of diols or in the form of diamines, they will be called, for the sake of simplicity, PEG blocks. The mean molecular weight Mn of the polyether sequences is comprised between 100 and 6,000 and is preferably between 300 and 3,000.

The polymers having polyamide blocks and polyether blocks can also comprise randomly-distributed moieties. Such polymers can be prepared by simultaneously reacting polyether and precursors of the polyamide blocks. For example, reaction can be caused between a polyetherdiol, a lactame, (or a corresponding alpha-omega aminoacid) and a chain limiting diacid, in the presence of a small amount of water. A polymer is obtained having essentially polyether blocks, polyamide blocks of greatly varying length, along with the various reagents that have reacted randomly and which are randomly distributed along the polymer chain.

The polymers having polyamide PA blocks and polyether PEG blocks have, for example, a Shore D hardness typically comprised between 20 and 75 and, advantageously, between 30 and 70, and an inherent viscosity comprised between 0.8 and 2.5, measured in metacresol at 25° C. for an initial concentration of 0.8 g/100 ml.

The polymers having PA blocks and PEG blocks can be formed, in by weight, by 5 to 85% of polyether PEG blocks (and 95 to 15% PA) and, preferably from 20 to 80% polyether PEG blocks (and from 80 to 20% PA) and, more preferably, from 30 to 70% polyether PEG blocks (and 70 to 30% PA)

Preferably, the polymer having polyamide blocks and polyether blocks comprises a single type of block. Advantageously, polymers having PA12 blocks and PEG blocks, and polymers having PA6 blocks and PEG blocks are employed.

One can however also employ blends of polymers having polyamide blocks and polyether blocks.

Such polymers having polyamide blocks and polyether blocks are available commercially from Elf Atochem under the commercial name Pebax®.

These polymers having PA blocks and PEG blocks have water vapor permeability characteristics, and are designated as being "hydrophilic" in the sense normally understood by the person skilled in the art.

These polymers having PA blocks and PEG blocks have characteristics of water vapor permeability and are designated as being "hydrophilic" as conventionally understood by the person skilled in the art.

These polymers have the surprising characteristic of conferring on the thermoplastic phase with which they are mixed, and in amounts distinctly lower than in the prior art:

a non porous breathable property on films obtained from the material according to the invention; and antistatic properties on objects obtained from the material according to the invention.

These properties are obtained even when the thermoplastic component (that is the polyamide and (functionalized) polyolefin)) constitutes the major portion, which is surprising as it is generally accepted in the art that such properties, in particular permeability to gasses, are conferred by the majority phase. This surprising and unexpected result makes it consequently possible to mix less hydrophilic material while still obtaining the desired properties, thereby reducing the cost of the final material. Moreover, the polymer (b) having PEG blocks according to the invention, when it is employed according to the prior art, in large amounts (in other words constituting the major portion) creates problems associated with a too high water take-up at equilibrium. However, such problems do not appear with the material according to the invention. The invention thus provides a material which makes it possible to obviate the problems associated with water-takeup while still guaranteeing high vapor permeability. Moreover, these properties and advantages are obtained regardless of what the polyolefin phase of the mixture is and of what polyamide is used. Moreover, the materials according to the invention are easy to transform, extrude, etc., i.e. they are readily processible.

The material according to the invention can also be mixed with conventional additives.

The films obtained from this material are non-porous and breathable, in other words they are permeable to water vapor but impermeable to water, and, more generally, permeable to gasses but impermeable to liquids.

These films can been prepared using any method known in the art, for example by extrusion. The films have a thickness comprised, typically, between 5 and 500 μm, preferably between 10 and 250 μm. The films can be associated with other films and/or supports.

The objects are defined as being "antistatic" as they have antistatic properties, signifying that their surface resistivity is for example comprised between $10^5$ and $10^{11}$ ohms/square.

The objects can be prepared using any method known in the art, for example by extrusion, injection, molding, etc.

The following examples illustrate the invention without limiting it.

EXAMPLES

In the examples, the following constituents are employed:

PEBA1: PEEA constituted of PA6 blocks (MW=1300) and polytetramethyleneglycol PTMG blocks (MW=650) having a Shore D hardness of 56;

PEBA2: PEEA constituted of PA6 blocks (MW=1500) and PEG blocks (MW=1500) of Share D hardness of 42;

PA1: PA6 Ultramid B3 from BASF with an MFI comprised between 17 and 20 (235° C./2.16 kg);

PA2: PA6 Ultramid B4 from BASF with an MFI comprised between 3 and 4 (275° C./2.16 kg);

PO1: LLDPE Clearflex from Enichem with an MFI of 0.8 (190° C./2.16 kg) and a density of 0.900;

PO2: ethylene/methyl acrylate copolymer having 24% acrylate with an MFI of 0.05 (190° C./2.16 kg);

PO3: PE metallocene Engage 8150 from Dow Chemical with an MFI of 0.5 (190° C./2.16 kg) and a density of 0.868);

POF1: ethylene/butyl acrylate/maleic anhydride terpolymer having a weight composition of 79.2/17.7/3.1 with an MFI of 4.5 (190° C./2.16 kg);

POF2: ethylene/methyl acrylate/glycidyl methacrylate terpolymer of weight composition 67/25/8 with an MFI of 4 to 8 (190° C./2.16 kg);

POF3: a mixture comprising 75/22/3 weight % of A/B/C in which A is an ethylene/butyl acrylate/maleic anhydride terpolymer having an MFI of 6 to 8 (190° C./2.16 kg), B is POF2 and C is a catalyst (DMS) for the maleic anhydride/glycidyl methacrylate reaction; the DMS (Dimethyl tallow amine) being in the form of DMS master mixture granules in component A.

The mixing and extrusion conditions are identical in all the examples. A co-rotating Werner Pfleiderer 40 mm diameter double screw extruder was used, L/D=40 (9 sleeves+4 spacers giving a total length of 10 sleeves). The various constituents (a), (b), optionally (c), and (d) are introduced independently, using three or four weight dispensers. Total extruder throughput is 50 kg/h and screw rotation speed is 150 rpm. Material temperatures at sleeves 4, 6, 8, and at the head are respectively 230° C., 235° C., 240° C. and 255° C. Outgassing during extrusion is carried out at sleeve 6 using a partial vacuum of +260 mm Hg. Extruded products are granulated and then fired under vacuum for 16 hours at 70° C. Next, the granules are extruded under standard conditions on a laboratory extruder fitted with a flat die and a shill roll to obtain films about 40 $\mu$m thick.

Water vapor permeability was measured according to ASTM 96 BM (38° C., 50% RH). Permeability is expressed in grams per m2 and per day (g/m2/d).

The results are given in the table below.

The results show that with a minimum amount of polymer having PA6 blocks and PEG blocks and a majority of another polymer part (polyamide in combination with polyolefins), it is possible to obtain a nonporous breathable film.

The results also show that in the case of a polyamide matrix, and regardless of the amount of polyolefin and functionalized polyolefin, the use of hydrophobic PEEA (PEBA1) leads to materials which are not nonporous breathable (examples D, 8, 9 and 11).

The result also show that at constant polyamide, polyolefin and functionalized polyolefin rates, replacing hydrophobic PEEA by hydrophilic PEEA leads to nonporous breathable materials (example 1, 6 and 7 compared to D; example 10 compared to 8 and 9; examples 12 and 13 compared to 11).

The examples also show that the nonporous breathable properties are directly a function of the amount of hydrophilic PEEA in the matrix (polyamide+PEEA). Flows are high when the percentages are 30%, 35% and 40%.

The examples additionally show that, for a given percentage of polyolefin and functionalized polyolefin, the nature of these polyolefin components only has a very small influence on the nonporous breathable properties (example 1, 6, 7, 10, 12 and 13).

Obviously, the present invention is not limited to the embodiments indicated but may be subject to numerous variations available to those skilled in the art.

(c) optionally a polyolefin;
(d) a functionalized polyolefin;
wherein the amounts by weight of a, b, c and d are such that:

$a>0$; $b>0$; $c+d>0$; $a+b+c+d=100$; with $a/b>0.2$; $(a+b)/(c+d)>1$; and $b/(a+b+c+d)<0.5$.

2. The mixture according to claim 1, in which the amounts by weight of a, b, c and d are such that:

$2>a/b>0.5$.

3. The mixture according to claim 1, in which the amounts by weight of a, b, c and d are such that:

$0.3<b/(a+b+c+d)<0.5$.

4. The mixture according to claim 1, in which in said polymer (b), the PA blocks are PA6 blocks.

5. The mixture according to claim 1, in which said polyamide is PA6.

6. The mixture according to claim 1, in which the polyamide is PA6 and the polymer having PA blocks and polyether PEG blocks is a PA6/PEG block polymer.

7. The mixture according to claim 6, in which the amounts by weight of a, b, c and d are such that:

$2>a/b>0.5$.

8. The mixture according to claim 7, in which the amounts by weight of a, b, c and d are such that:

$0.3<b/(a+b+c+d)<0.5$.

9. The mixture according to claim 1, in which the polymide is PA6,6 and the polymer having PA blocks and polyether PEG blocks is a PA6/PEG block polymer.

10. The mixture according to claim 9, in which the amounts by weight of a, b, c and d are such that:

$2>a/b>0.5$.

11. The mixture according to claim 9, in which the amounts by weight of a, b, c and d are such that:

$0.3<b/(a+b+c+d)<0.5$.

| Example | A | B | C | D | 1 | 2 | 3 | 4 | 5 | 6 | 7 | 8 | 9 | 10 | 11 | 12 | 13 |
|---|---|---|---|---|---|---|---|---|---|---|---|---|---|---|---|---|---|
| PEBA1 | | | | 35 | | | | | | | | 35 | 35 | | 35 | | |
| PEBA2 | | | | | 35 | 40 | 30 | 20 | 10 | 35 | 35 | | | 35 | | 35 | 35 |
| PA1 | 100 | 65 | 60 | 25 | 25 | 20 | 30 | 40 | 50 | 25 | 25 | 25 | | 25 | 25 | 25 | |
| PA2 | | | | | | | | | | | | | 25 | | | | 25 |
| PO1 | | 25 | 32 | 32 | 32 | 32 | 32 | 32 | 32 | | | 32 | 32 | 32 | | | |
| PO2 | | | | | | | | | | 32 | | | | | | | |
| PO3 | | | | | | | | | | | 32 | | | | | | |
| POF1 | | 10 | 8 | 8 | 8 | 8 | 8 | 8 | 8 | 8 | 8 | | | | | | |
| POF2 | | | | | | | | | | | | 8 | 8 | 8 | | | |
| POF3 | | | | | | | | | | | | | | | 40 | 40 | 40 |
| a/b | | | | 0.71 | 0.71 | 0.5 | 1 | 2 | 5 | 0.71 | 0.71 | 0.71 | 0.71 | 0.71 | 0.71 | 0.71 | 0.71 |
| (a + b)/(c + d) | | | | 1.5 | 1.5 | 1.5 | 1.5 | 1.5 | 1.5 | 1.5 | 1.5 | 1.5 | 1.5 | 1.5 | 1.5 | 1.5 | 1.5 |
| b/(a + b + c + d) | | | | 0.35 | 0.35 | 0.4 | 0.3 | 0.2 | 0.1 | 0.35 | 0.35 | 0.35 | 0.35 | 0.35 | 0.35 | 0.35 | 0.35 |
| thickness ($\mu$m) | nd | nd | nd | 37 | 42 | 43 | 41 | 39 | 33 | 45 | 44 | 38 | 35 | nd | nd | nd | nd |
| Permeability (g/m2/d) | nd | nd | nd | 425 | 20528 | 23456 | 16502 | 2095 | 589 | 18699 | 17638 | 2166 | 301 | nd | nd | nd | nd | nd: not determined

What is claimed is:

1. A mixture comprising:
   (a) a polyamide;
   (b) a polymer having PA blocks and polyether PEG blocks;

12. The mixture according to claim 1, in which the polyamide is PA12 and the polymer having PA blocks and polyether PEG blocks is a PA12/PEG block polymer.

13. The mixture according to claim 12, in which the amounts by weight of a, b, c and d are such that:

$2>a/b>0.5$.

14. The mixture according to claim 12, in which the amounts by weight of a, b, c and d are such that:

$0.3<b/(a+b+c+d)<0.5$.

15. The mixture according to claim 1, in which the polyamide is PA6 and the polymer having PA blocks and polyether PEG blocks is a PA1 2/PEG block polymer.

16. The mixture according to claim 15, in which the amounts by weight of a, b, c and d are such that:

$2>a/b>0.5$.

17. The mixture according to claim 15, in which the amounts by weight of a, b, c and d are such that:

$0.3<b/(a+b+c+d)<0.5$.

18. The mixture according to claim 1, in which the functionalized polyolefin (d) is selected from:
   (d1) ethylene and alpha-olefin homo- or copolymers with a monomer being a carboxylic acid, an anhydride of said acid, a salt of said acid, or an unsaturated epoxide, said monomer being grafted or terpolymerized;
   (d2) copolymers of ethylene/alkyl (meth)acrylate/ unsaturated monomer having a carboxylic acid functionality or carboxylic acid anhydride functionality, said monomer being grafted or terpolymerized;
   (d3) copolymers of ethylene/alkyl (meth)acrylate/ unsaturated monomer having an epoxy functionality, said monomer being grafted or terpolymerized;
   (d4) copolymers of ethylene/carboxylic acid vinyl esters/ unsaturated monomer having carboxylic acid functionality or carboxylic acid anhydride functionality, said monomer being grafted or terpolymerized; said functionalized polyolefins being optionally mixed with a di-functional reactive unit.

19. The mixture according to claim 1, in which the functionalized polyolefin (d) is an ethylene/butyl acrylate/ maleic anhydride copolymer.

20. The mixture according to claim 1, in which the functionalized polyolefin (d) is an ethylene/ethyl acrylate/ glycidyl methacrylate copolymer.

21. The mixture according to claim 6, in which the functionalized polyolefin (d) is an ethylene/butyl acrylate/ maleic anhydride copolymer.

22. The mixture according to claim 6, in which the functionalized polyolefin (d) is an ethylene/ethyl acrylate/ glycidyl methacrylate copolymer.

23. The mixture according to claim 9, in which the functionalized polyolefin (d) is an ethylene/butyl acrylate/ maleic anhydride copolymer.

24. The mixture according to claim 9, in which the functionalized polyolefin (d) is an ethylene/ethyl acrylate/ glycidyl methacrylate copolymer.

25. The mixture according to claim 12, in which the functionalized polyolefin (d) is an ethylene/butyl acrylate/ maleic anhydride copolymer.

26. The mixture according to claim 12, in which the functionalized polyolefin (d) is an ethylene/ethyl acrylate/ glycidyl methacrylate copolymer.

27. The mixture according to claim 15, in which the functionalized polyolefin (d) is an ethylene/butyl acrylate/ maleic anhydride copolymer.

28. The mixture according to claim 15, in which the functionalized polyolefin (d) is an ethylene/ethyl acrylate/ glycidyl methacrylate copolymer.

29. The mixture according to claim 1, in which said polyolefin (c) is polyethylene.

30. The mixture according to claim 6, in which said polyolefin (c) is polyethylene.

31. The mixture according to claim 9, in which said polyolefin (c) is polyethylene.

32. The mixture according to claim 12, in which said polyolefin (c) is polyethylene.

33. The mixture according to claim 15, in which said polyolefin (c) is polyethylene.

34. The mixture according to claim 19, in which said polyolefin (c) is polyethylene.

35. The mixture according to claim 20, in which said polyolefin (c) is polyethylene.

36. An object having surface resistivity between $10^5$ and $10^{11}$ ohms/square obtained from the mixture according to claim 1.

37. A nonporous breathable film obtained from the mixture according to claim 1.

38. The mixture according to claim 1, in which the functionalized polyolefin is a polyolefin functionalized with a reactive unit selected from the group consisting of acid, anhydride and epoxy.

* * * * *